US012763765B2

(12) United States Patent
Domes et al.

(10) Patent No.: US 12,763,765 B2
(45) Date of Patent: Oct. 13, 2026

(54) CIRCUIT, SYSTEM AND METHOD RELATED TO A DUAL GATE TRANSISTOR ARRANGEMENT

(71) Applicant: Infineon Technologies Austria AG, Villach (AT)

(72) Inventors: Daniel Domes, Werl (DE); Richard Kuchcinski, Warstein (DE)

(73) Assignee: Infineon Technologies Austria AG, Villach (AT)

( * ) Notice: Subject to any disclaimer, the term of this patent is extended or adjusted under 35 U.S.C. 154(b) by 23 days.

(21) Appl. No.: 19/064,163

(22) Filed: Feb. 26, 2025

(65) Prior Publication Data

US 2025/0293680 A1 Sep. 18, 2025

(30) Foreign Application Priority Data

Mar. 14, 2024 (DE) ........................ 102024107303.9

(51) Int. Cl.
*H03K 17/082* (2006.01)

(52) U.S. Cl.
CPC ................................ *H03K 17/0822* (2013.01)

(58) Field of Classification Search
CPC . H03K 17/0822; H03K 17/296; H03K 17/567
USPC .......................................................... 327/427
See application file for complete search history.

(56) References Cited

U.S. PATENT DOCUMENTS

| | | | | |
|---|---|---|---|---|
| 5,561,393 | A * | 10/1996 | Sakurai | H03K 17/567 257/E29.198 |
| 9,455,697 | B2 * | 9/2016 | Norling | H03K 17/102 |
| 11,349,474 | B1 * | 5/2022 | Yelamos Ruiz | G01R 19/145 |
| 2017/0250260 | A1 * | 8/2017 | Bina | H10D 30/668 |
| 2017/0250685 | A1 * | 8/2017 | Bina | H03K 17/567 |
| 2019/0273494 | A1 * | 9/2019 | Matsumoto | H03K 17/567 |
| 2023/0231018 | A1 * | 7/2023 | Kinoshita | H10D 30/4755 |
| 2025/0293680 | A1 * | 9/2025 | Domes | H03K 17/0822 |

FOREIGN PATENT DOCUMENTS

DE 102017103765 A1 8/2017

OTHER PUBLICATIONS

Miyoshi, et al., "Dual side-gate HiGT breaking through the limitation of IGBT loss reduction", PCIM Europe 2017, Nuremberg, Germany, May 16-18, 2017, 315-322.

* cited by examiner

*Primary Examiner* — Ryan Jager
(74) *Attorney, Agent, or Firm* — Murphy, Bilak & Homiller, PLLC

(57) ABSTRACT

A circuit includes an input node configured to receive a gate control signal for controlling a dual gate transistor arrangement, a first output node configured to be coupled to a first gate node of the dual gate transistor arrangement, a first switch coupled between the input node and the first output node, and a second output node configured to be coupled to a second gate node of the dual gate transistor arrangement and coupled to the input node. A control circuit is configured to, upon detecting that the gate control signal indicates a turn-off of the dual gate transistor arrangement, open the first switch for a first predefined time period, and close the first switch after the first predefined time period.

20 Claims, 5 Drawing Sheets

CIRCUIT, SYSTEM AND METHOD RELATED TO A DUAL GATE TRANSISTOR ARRANGEMENT

TECHNICAL FIELD

The present application relates to circuits, systems and methods related to dual gate transistor arrangements.

BACKGROUND

Transistors like insulated gate bipolar transistors (IGBTs) are usually three-terminal devices, meaning that they have two load nodes, collector and emitter in case of an IGBT, and a control node for providing an electrical control potential, which in case of an IGBT is the gate node.

IGBTs are bipolar devices. This means that there is relationship between a saturation voltage between collector and emitter (usually abbreviated $V_{CEsat}$) in conduction mode, i.e. when the IGBT is turned on, and a turn-off energy required when the IGBT is turned off, i.e. is controlled to change its state from the conduction mode into a blocking mode. During conduction mode, a high number of electron-hole-pairs are built up and stored in the IGBT leading to high electrical conductivity. When turning off the IGBT, all the electron-hole-pairs have to be removed so that the IGBT is able to provide the blocking voltage, which leads to turn-off losses. In a design stage of an IGBT, the design is adjusted according to requirements of a target application. In this design process, low conduction losses (low saturation voltages) are typically traded against high turn-off energies and vice versa. To mitigate the necessity for such a trade-off, dual gate transistor arrangements have been developed. In case of a dual gate IGBT, for example in a single device two gate electrodes act on different channel regions on the same IGBT chip die. Each gate electrode of the IGBT is controlled separately. In normal conduction mode, both gates are in an on-state and the total device behaves like a device with a low saturation voltage. In case of a turn-off event, the two gates are switched off sequentially, which reduces the turn-off energy losses. With such a device, low turn-off energies leading to faster switching and low saturation voltages may be obtained. On the other hand, two gate terminals need to be controlled, which requires additional effort, such as gate drivers with two outputs and corresponding control methods, increasing the complexity of such systems.

SUMMARY

According to an embodiment, a circuit is provided, comprising an input node configured to receive a gate control signal for controlling a dual gate transistor arrangement, a first output node configured to be coupled to a first gate node of the dual gate transistor, a first switch coupled between the input node and the first output node, and a second output node configured to be coupled to a second gate node of the dual gate transistor arrangement and coupled to the input node. Furthermore, the circuit comprises a control circuit configured to, upon detecting that the gate control signal indicates a turn-off of the dual gate transistor arrangement, open the first switch for a first predefined time period, and close the first switch after the first predefined time period.

According to a further embodiment, a device is provided, comprising the circuit as above and the dual gate transistor arrangement.

According to a further embodiment, a method is provided, comprising: receiving a gate control signal indicating a turn-off of a dual gate transistor, and decoupling a first gate node of the dual gate transistor arrangement from the gate control signal for a first predefined time period.

The above summary constitutes merely a short overview over some embodiments and is not to be construed as limiting in any way, as other embodiments may comprise different features.

DETAILED DESCRIPTION

In the following, various embodiments will be described referring to the attached drawings. These embodiments are given by way of example only and are not to be construed as limiting. Details or variations described with respect to one of the embodiments are also applicable to other embodiments and will therefore not be described repeatedly. Features from different embodiments may be combined to form further embodiments.

As used herein, the terms “open”, “off”, “switched off”, “turned off” or “blocking” are used synonymously with respect to switches or transistors where the switch or transistor is essentially non-conducting between its load nodes (apart possibly from undesired leakage current). Conversely, “closed”, “on”, “switched on”, “turned on” or “conducting” relate to a state where the transistor or switch is electrically conducting with a low resistance (usually referred to as on-resistance) between its load terminals.

Figure 1:
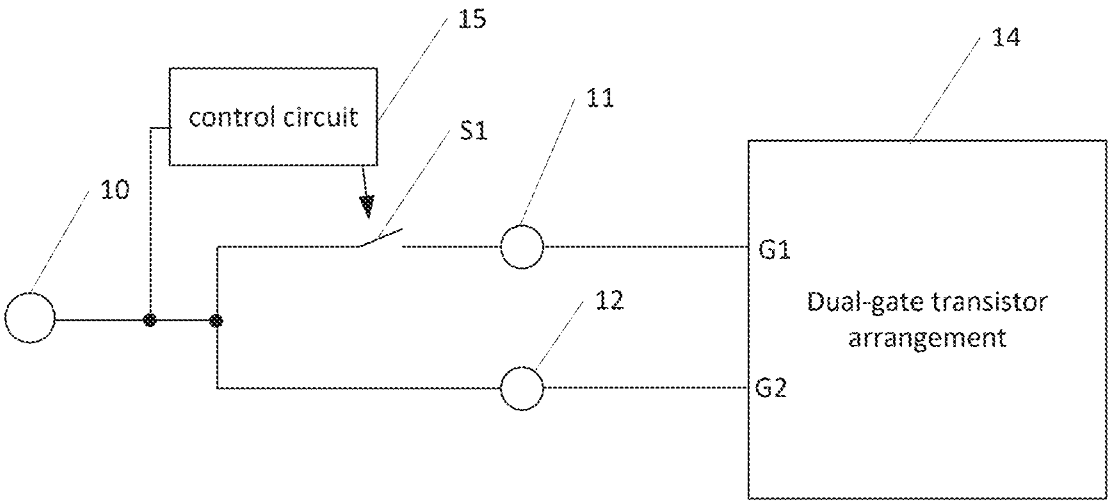
FIG. 1 is a block diagram of a device according to an embodiment.

Turning now to the figures, FIG. 1 is a block diagram of a device according to an embodiment. The device of FIG. 1 includes a dual gate transistor arrangement 14 and a circuit including a first switch S1, an input node 10, a first output node 11, a second output node 12 and a control circuit 15.

Dual gate transistor arrangement 14 has a first gate node G1 and a second gate node G2. Furthermore, while not shown in FIG. 14, dual gate transistor arrangement 14 includes at least two load terminals, for example a collector terminal and an emitter terminal in case of an insulated gate bipolar transistor (IGBT) dual gate transistor arrangement. For dual gate transistor arrangement 14 to be switched on, corresponding control signals may be applied both to first gate node G1 and second gate node G2.

Input node 10 is configured to receive a gate control signal for dual gate transistor arrangement 14. The gate control signal may be a signal having two possible voltage levels (high and low) for switching dual gate transistor arrangement 14 on and off.

Input node 10 is coupled to first output node 11 via first switch S1 and coupled directly to second output node 12 as shown. First output node 11 is coupled to first gate node G1 of dual gate transistor arrangement 14, and second output node 12 is coupled to second gate node G2 of dual gate transistor arrangement 14.

In stationary operation, i.e., outside of switching events for dual gate transistor arrangement 14, first switch S1 is closed, such that a gate control signal applied to input node 10 is provided to both gate nodes G1, G2, to keep the transistor turned on or turned off. In some embodiments, first switch S1 may be a normally on-switch, i.e., a switch which is on when no control signal is applied to first switch S1. This means that in the above-mentioned stationary operation no control signal has to be applied to first switch S1.

When the dual gate transistor arrangement 40 is to be brought from an off-state to an on-state, i.e., turned on, switch S1 remains closed, such that the transition of the gate control signal applied to input node 10 is applied to both gate nodes G1, G2 simultaneously.

When the dual gate transistor arrangement 14 is to be switched off, for example when the gate control signal applied to input node 10 transitions from a logic high to a logic low, this transition is detected by control circuit 15. For example, control circuit 15 may detect the transition as soon as the gate control signal falls below a predefined threshold, which is lower than the above high level by a margin. The margin is selected to account for fluctuations of the gate control signal during stationary operation. Upon detecting that the gate control signal indicates a turn-off of dual gate transistor arrangement 14, control circuit 15 controls first switch S1 to open for a first predefined time period, for example between 1 and 50 μs or between 5 and 20 μs. Control circuit 15 is therefore configured to control a switching state of first switch S1 between an open state and a closed state, and configured to receive the gate control signal indication signal (here the gate control signal itself, but it may also be a signal derived therefrom) that indicates whether the gate control signal indicates an on-state or an off-state of the transistor, and wherein control circuit 15 is configured to open first switch S1 for the first predetermined time period if the indication signal indicates a transition from on-state to off-state (i.e., turn-off).

During this predefined first time period, second gate node G2 is brought to the potential given by the gate control signal, e.g. low level, in which case second gate node G2 is discharged. After the first predefined time period, switch S1 is again closed, and then also first gate node G1 is brought to the corresponding low level, i.e. discharged. Due to this stepwise discharging of the gate nodes, the turn-off energy will be reduced, as explained further below.

In the embodiment of FIG. 1, switch S1, when open, at least blocks current from first gate node G1 to input node 10, to prevent discharging of first gate node G1. Therefore, S1 may be a unidirectional switch, which in an open state blocks current only in this direction from first gate node G1 to input terminal 10. In other embodiments, first switch S1 may be a bidirectional switch, which, when open, blocks currents in both directions. Details on the use of bidirectional and unidirectional switches will be explained further below referring to FIGS. 6A to 6E.

Figure 2:
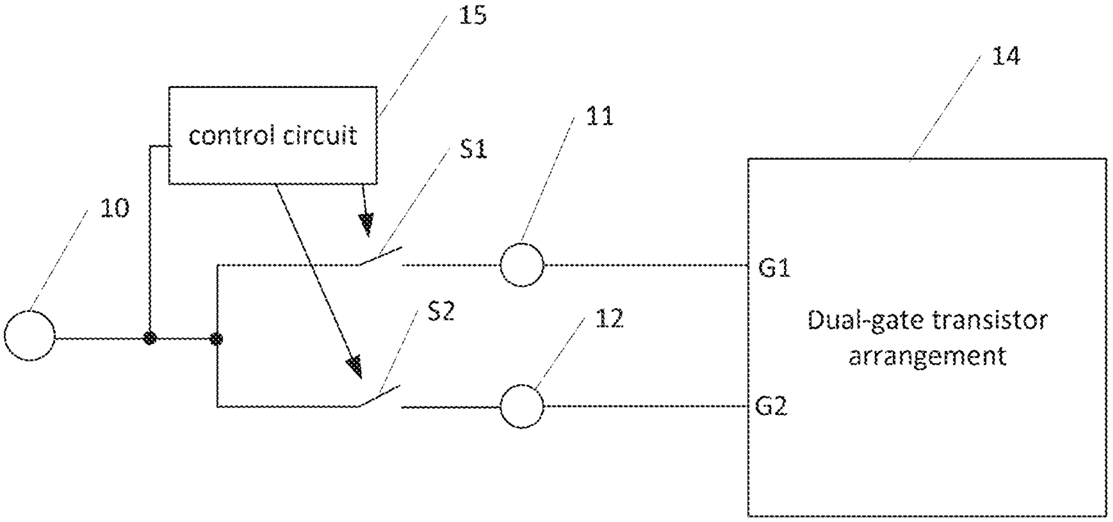
FIG. 2 is a block diagram of a device according to a further embodiment.

FIG. 2 shows a device according to a further embodiment, which is a variation of the device of FIG. 1. Compared to FIG. 1, additionally a second switch S2 between input node 10 and second output node 12 is provided. Second switch S2 also may be a normally on switch. In operation, after the first predefined time period when the first switch S1 was open has elapsed, i.e., after closing first switch S1 again after expiry of the first predefined time period, control circuit 15 causes second switch S2 to open for a second predefined time period. The second predefined time period may have a duration in the ranges given above for the first predefined time period, and may be equal to or different from the duration of the first predefined time period. When opened, second switch S2 blocks current at least from input node 10 to second output node 12 or (which is the same current direction) from first output node 11 to second output node 12. For this, second switch S2 may be a unidirectional switch. In other embodiments, second switch S2 may be a bidirectional switch. As mentioned, details regarding unidirectional and bidirectional switches will be explained further below referring to FIGS. 6A to 6E.

By being opened for the second predefined time period, in the embodiment of FIG. 2 second switch S2 may prevent a re-charging of second gate node G2 by charge flowing from first gate node G1, and thereby avoiding an unintentional turn-on event at second gate node G2.

The device of FIG. 1 or 2 may be implemented as a unitary device within a single housing, where the dual gate transistor arrangement 14 may for example be implemented on a first chip die and the circuit including control circuit 15 and switches S1, S2 may be implemented in another chip die. Such a housing may have a single gate terminal coupled to input node 10 and hence the device requires only a conventional single-channel gate driver. Furthermore, such a housing may have a collector and emitter terminal. Therefore, unlike some conventional solutions, no two gate drivers or dual-channel gate drivers are necessary. In other embodiments, the device of FIGS. 1 and 2 may be implemented on a single chip die. Furthermore, such a housing may have a second emitter terminal connected to an emitter node of the dual gate transistor arrangement in the housing and providing a return path for the gate driver.

Figure 3A:
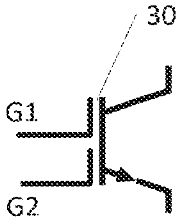
FIGS. 3A and 3B show examples of transistor arrangements.
Figure 3B:
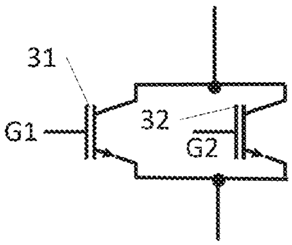

FIGS. 3A and 3B show different possibilities for implementing dual gate transistor arrangement 14 of FIGS. 1 and 2.

FIG. 3A shows a first implementation example, with a single dual gate IGBT 30. This dual gate IGBT 30 has two gates which act on the essentially same active area or region. They share the same emitter and collector node, which may also be referred to as emitter and collector electrodes, and act on the same semiconductor volumes. In case both gates are on, two channels are formed in parallel, which in turn means a high channel conductivity and high carrier confinement in the bulk below the corresponding IGBT cell. This carrier confinement leads to a higher concentration of bipolar charge carriers and thus to good electric conductivity. This good conductivity corresponds to a low collector-emitter voltage drop when on, in particular a low saturation voltage.

When dual gate IGBT 30 is switched off as explained referring to FIG. 1, one channel (coupled to second gate node G2 in the examples above) is switched off first. During the first predefined time period, the load current splits in a first portion which continues to flow via the channel associated with first gate node G1, while a second portion is fed by the stored bipolar charge carriers in the channel associated with second gate node G2. As the gate-emitter-voltage between G2 and emitter is zero or negative, which means that the associated channel region is closed, holes in this area of IGBT 30 can flow off, which reduces the number of carriers confined in the bulk. The voltages involved in this phase are not too high (up to several volts typically), because one channel is still conducting and therefore the collector-emitter voltage is still considerably lower than in the off state. The reduction of the carrier aggregation enables comparatively low switching losses. At the end of the first predefined time period the initial carrier aggregation has been significantly reduced.

When after the first predefined time period the other channel now is also switched off (first switch S1 is closed again, such that the first gate node G1 now also is set to the corresponding voltage for switching off dual gate IGBT 30), the collector-emitter-voltage rises towards the blocking voltage of the respective application. The remaining carriers now have to be removed with this higher collector-emitter-voltage applied resulting in the typical IGBT tail current flowing through the device. However, as the carrier aggregation has already been reduced and hence the tail current is reduced, the overall losses for the turn-off of dual gate transistor arrangement 14 are lower than in a conventional single gate transistor.

FIG. 3B shows an alternative implementation of a dual gate transistor arrangement, where two IGBT transistors 31, 32 are coupled in parallel, i.e., their collectors are coupled together and their emitters are coupled together. First gate node G1 is coupled to the gate of IGBT 31, and second gate node G2 is coupled to the gate of IGBT 32.

IGBTs 31, 32 may be integrated on a same chip die, e.g. monolithically integrated, or may be provided on separate chip dies. IGBTs 31, 32 may be nominally identical (i.e. identical by design, with deviations only due to manufacturing tolerances or caused by aging). In this case, the operation and effects are similar to the case of FIG. 3A. In the implementation of FIG. 3B, the effect of combining low saturation voltage with low switching losses effect may even be enhanced by designing IGBTs 31, 32 differently. For example, IGBT 32, which is switched off first in the scheme described above, may be optimized for low conduction losses in a turned-on state, i.e. low collector-emitter saturation voltage. As explained in the background section, this usually leads to higher switching losses. However, as IGBT 32 is switched off first when IGBT 31 is still conducting and the voltage drop across the dual gate transistor arrangement is comparatively low, the switching losses are still reduced. IGBT 31, which is then switched off at higher collector-emitter voltages as then the blocking voltage builds up, may be optimized for low switching losses.

The implementations of FIGS. 3A and 3B serve only as examples.

Figure 4:
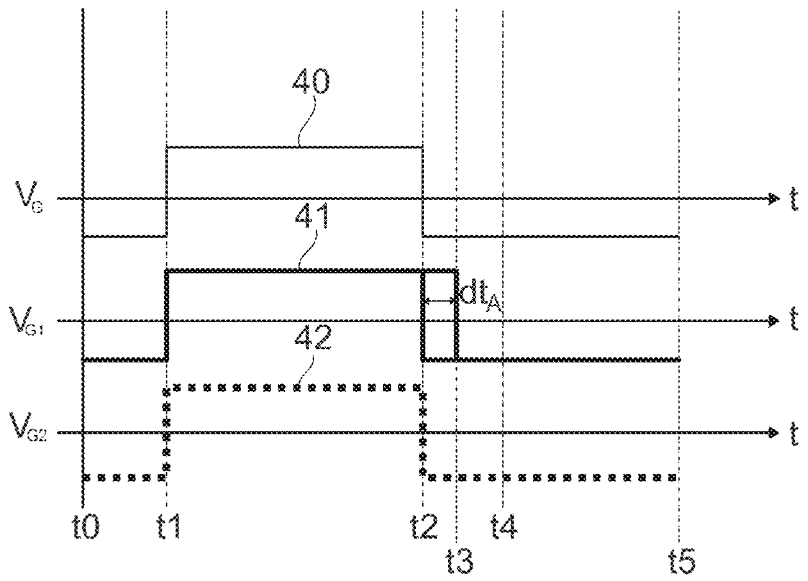
FIG. 4 is a timing diagram illustrating operation of some embodiments.

FIG. 4 illustrates the above-described operation of the embodiment of FIGS. 1 and 2. A curve 40 illustrates an example gate control signal applied for example to input node 10 of FIG. 1. At a time to, first switch S1 and, if provided, also second switch S2 are closed. Therefore, as shown in curve 41 for first gate node G1 and curve 42 for second gate node G2, also the potential at the gate nodes is low.

At a time t1 the gate control signal of curve 40 transitions to high, to switch the dual gate transistor arrangement 14 on. As switch S1 (and also switch S2, if provided) are closed, this also sets the gate nodes G1, G2 to a high potential as shown in curves 41 and 42, thus switching dual gate transistor arrangement 14 on.

At t2, dual gate transistor arrangement 14 is to be turned off again, and the gate control signal according to curve 40 transitions to low. In response to detecting the transition of the gate control signal, as explained above, control circuit 15 opens switch S1 for the first predefined time period, in the example of FIG. 4 a time period from t2 to t3. A time duration between t2 and t3 may be in the range of 1 μs to 20 μs, but is not limited thereto. During this time, second output node 12 and hence second gate node G2 is electrically coupled to input node 10 (either directly in FIG. 1 or via closed second switch S2 in FIG. 2). Therefore, as shown in curve 42 the voltage at second gate node G2 also drops to low at t2, while the voltage at first gate node G1 as shown in curve 41 essentially maintains its level until it also drops at t3. If second switch S2 is provided as in FIG. 2, then, after the first predefined period, second switch S2 may be open for a second predefined period, which prevents that second gate node G2 is charged by first gate node G1 when first switch S1 is closed again. A next switching event may be performed after a certain time the system requires to settle, for example after t4. A time duration between t3 and t4 may be in the range of 0.5 μs to 5 μs, but is not limited thereto. In FIG. 4, transistor arrangement 14 remains open, i.e. turned off, until t5, which is the last time shown in FIG. 4.

It should be noted that the waveforms shown in FIG. 4 are idealized waveforms with essentially perpendicular edges. In real systems, the rise and fall of the signals may not occur immediately, but over a certain time, and also due to propagation delays, for example curves 41 and 42 may lag slightly behind curve 40. Therefore, FIG. 4 is to be seen as schematic illustration illustrating the principle of operation, but not as exact measured waveforms.

Figure 5:
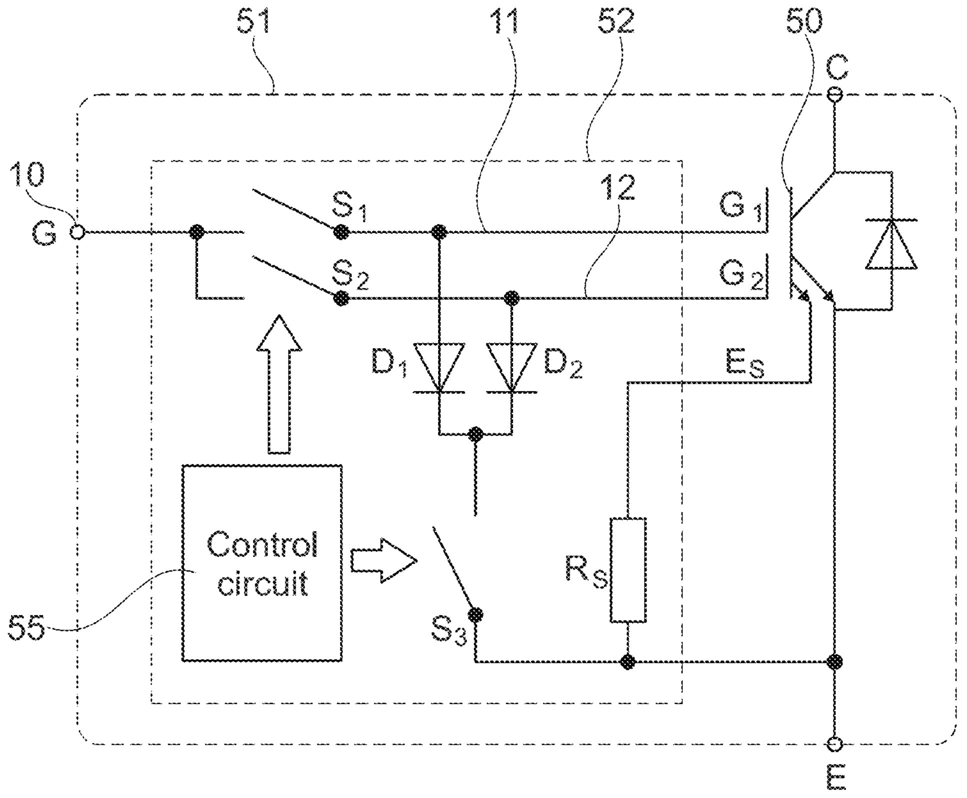
FIG. 5 illustrates a device according to a further embodiment.

In addition to the switching in normal operation, a protection against faults is often desirable. FIG. 5 illustrates a case where an additional error protection is provided.

FIG. 5 is a diagram of a device 51 according to a further embodiment, including a circuit 52 and a dual gate insulated gate bipolar transistor 50. Insulated gate bipolar transistor 50 is an example for a dual gate transistor arrangement, and other dual gate transistor arrangements, for example as discussed with respect to FIGS. 3A and 3B, may also be used. In device 51, components and elements that were already discussed with reference to FIGS. 1 and 2 bear the same reference numerals and will not be discussed again in detail.

Device 51 may be provided in a housing having a gate terminal G coupled to input node 10, a collector terminal C coupled to the collector of dual gate IGBT 50 and an emitter terminal E coupled to the emitter of dual gate IGBT 50. Circuit 52 includes switches S1 und S2 already discussed with reference to FIGS. 1 and 2 and a control circuit 55. During normal operation, as long as no overcurrent is detected as explained further below, control circuit 55 controls switches S1 and S2 as explained above with respect to FIGS. 1, 2 and 4.

Circuit 52 may be implemented on a chip die separate from dual gate IGBT 50 or may be implemented on the same chip die.

As explained above for the embodiment of FIGS. 1 and 2, a single gate terminal G accessible from outside the housing is provided and therefore a single gate driver is sufficient for controlling device 51.

In addition, circuit 52 includes an overcurrent detection mechanism. To this end, control circuit 55 is configured to measure a current through dual gate IGBT 50. In the embodiment shown in FIG. 5, to this end dual gate IGBT 50 includes an auxiliary emitter terminal $E_S$ coupled to a measurement resistor $R_S$. A voltage drop across measurement resistor $R_S$ is then indicative of the collector-emitter current through dual gate IGBT 50 and is measured by control circuit 55. Other current measurements may also be used. For example, the current may also be measured without an auxiliary emitter terminal directly between dual gate IGBT 50 and emitter terminal E, for example using a measurement resistor or also using for example magnetic field measurements using magneto-resistive elements.

Furthermore, circuit 52 comprises a third switch S3, a first diode D1 and a second diode D2. First output node 11 is coupled to the emitter of dual gate IGBT 50 via first diode D1 and third switch S3, and second output node 12 is coupled to the emitter via second diode D2 and third switch S3. In other embodiments, two third switches may be provided, one for the connection of first output node 11 to the emitter and one for the connection of second output node 12 and the emitter.

When control circuit 55 determines that the sensed current exceeds a predefined threshold (overcurrent condition, for example due to a short circuit), it controls switches S1, S2 to open and switch S3 to close. Switch S3 may be a normally off switch. This couples first and second gate nodes G1, G2 to the emitter of dual gate IGBT 50, which reduces the gate-emitter voltage to close to zero and therefore turns dual gate IGBT 50 off, shutting down the overcurrent. As switches S1 and S2 are open, the gate control signal at input node 10 is decoupled from gate nodes G1, G2, such that dual gate IGBT 50 is not held open by the gate control signal.

Control circuit 15 of FIG. 2 and control circuit 55 of FIG. 5 may be implemented as any suitable logic. It may be supplied with power externally, or may be supplied with power based on a voltage between input node 10 and emitter terminal E. Such a voltage may for example charge a buffer capacitor supplying control circuit 55 with power. As the logic controlling the opening of switch S1 and S2 when turning the transistor arrangement off, which turning off follows a high state of the voltage at input node 10 (see FIG. 4), and also the overcurrent protection is only needed when the gate control signal is high in order to close, i.e. turn on, the dual gate transistor arrangement, this supplies the control circuit 15 or 55 with power when it is needed. When the dual gate transistor arrangement is off anyway, and no high voltage is at input node 10, also control circuit 15 or 55 are not required to be operative at this time, such that it needs not be supplied with power.

In the embodiment of FIG. 5, switches S1 and S2 may be implemented as bidirectional switches. Switch S3 may be implemented as unidirectional switch, which, when open, blocks current from the first and second output nodes 11, 12 to the emitter terminal E, while diodes D1, D2 block current in the opposite direction, or may be a bidirectional switch. Operation and implementation of switches S1, S2 as bidirectional switches will now be explained referring to FIGS. 6A to 6E.

Switches are often implemented using transistors like MOSFET transistors or also insulated gate bipolar transistors. Such transistors usually have a body diode or a freewheeling diode, like the diode shown for dual gate IGBT 50 in FIG. 5. This means that for example a single MOSFET usually serves as a unidirectional switch, as, even if the transistor is turned off, current may always flow via the body diode in one direction. To implement a bidirectional switch, for example two MOSFET transistors may be coupled in series with opposite polarities of the body diodes.

FIGS. 6A to 6E illustrate example implementation of first switch S1 and second switch S2 in such a configuration, where switch S1 is shown as including a first unidirectional switch $S_{1V}$ and a second unidirectional switch Sir, and switch S2 is shown as including a first unidirectional switch $S_{2V}$ and a second unidirectional switch $S_{2R}$. Each of the unidirectional switches is depicted as a switch with a body diode and may for example be implemented using a MOSFET transistor. The body diodes of switches $S_{1V}$ and SR have opposite polarities, and the body diodes of switches $S_{2V}$ and $S_{2R}$ also have opposite polarities, as shown in FIGS. 6A to 6E.

Figure 6A:
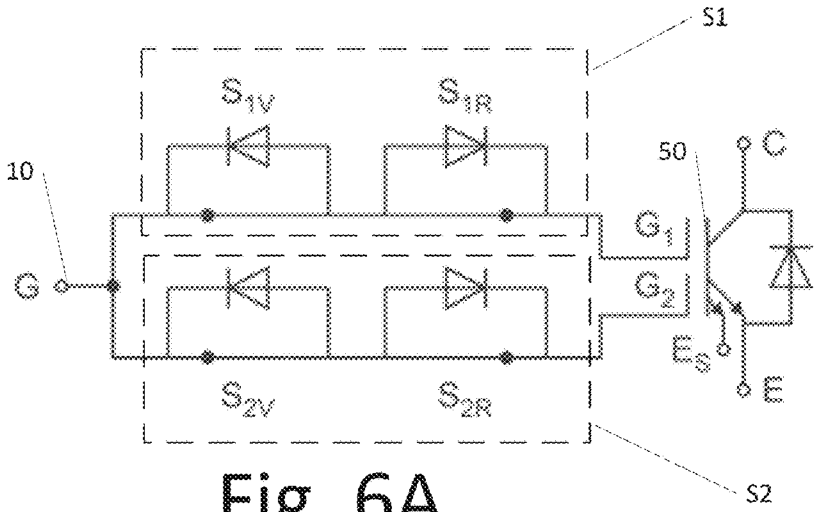
FIGS. 6A to 6E illustrate the use of bidirectional switches in some embodiments.

FIG. 6A shows a quasistatic state of the switches, which is used outside overcurrent conditions and outside switching the dual gate transistor arrangement off, for example between times to and t2 of FIG. 4 and between times t4 and t5 of FIG. 4. Here, all switches $S_{1V}$, $S_{1R}$, $S_{2V}$, $S_{2R}$ are closed. In this state, the voltage at first and second gate nodes G1, G2 essentially correspond to the voltage provided by the gate control signal at input node 10.

Figure 6B:
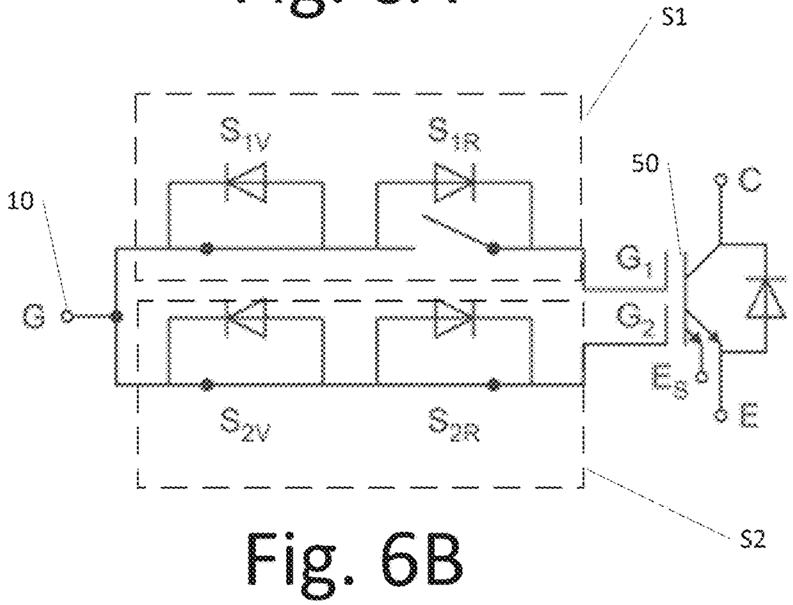

FIG. 6B shows a case when control circuit 15 or 55 detects a falling edge of the gate control signal, i.e. detects that dual gate IGBT 50 is to be switched off. In this case, at least switch $S_{1R}$ is opened, which prevents discharging of first gate node G1, for the first predefined time. Note that switch $S_{1V}$ may also be opened (for example if a common control signal is used for switches $S_{1V}$, $S_{1R}$), or may remain closed.

Figure 6C:
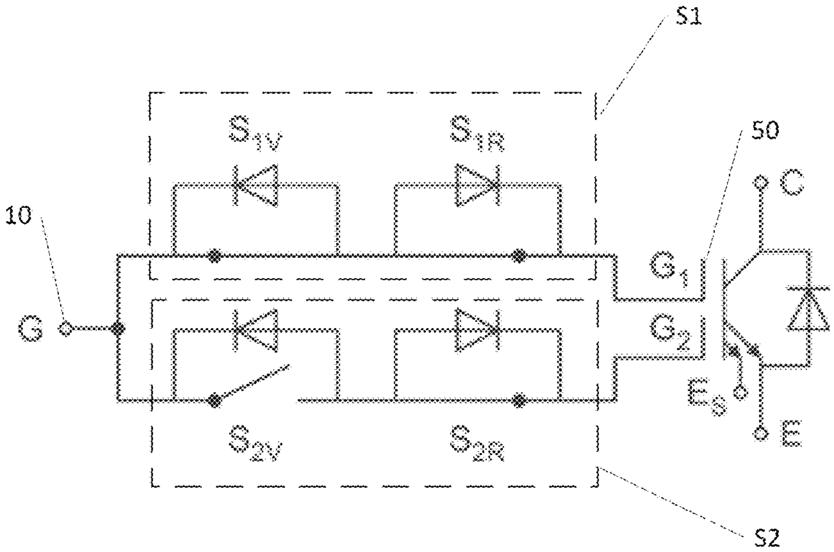

FIG. 6C shows an example case for the opening of the second switch for the second predefined time period after the first switch has closed again, as explained with reference to FIG. 2. Here, at least switch $S_{2V}$ is open, preventing charging of second gate node G2 by the discharging of first gate node G1. Switch $S_{2R}$ may also be open, or may remain closed.

FIGS. 6B and 6C also illustrate that for the functionality explained with reference to FIGS. 1 and 2, switches S1 and S2 also may be unidirectional switches, which means that only switches $S_{1R}$ and $S_{2V}$ need to be provided.

Figure 6D:
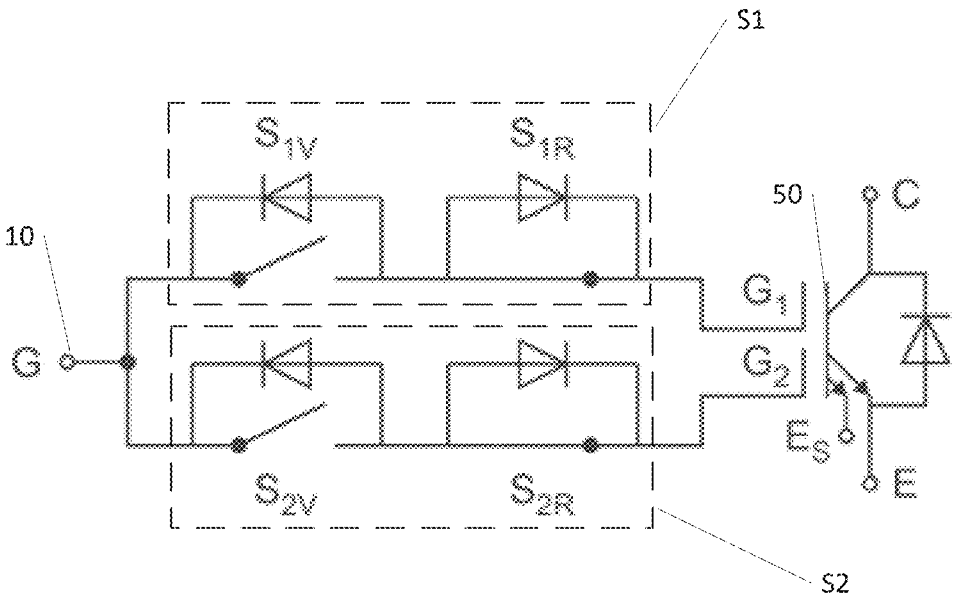
Figure 6E:
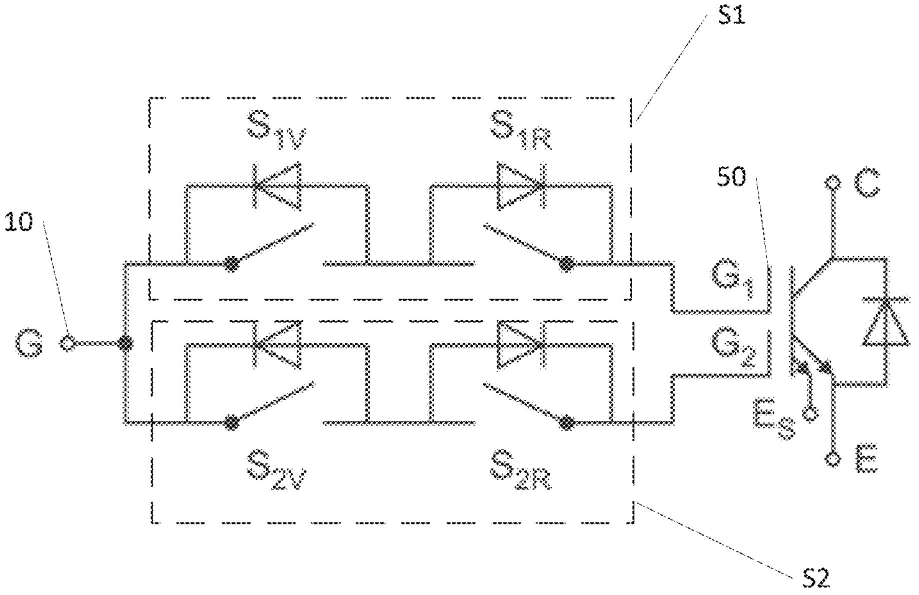

In case of an overcurrent detection as explained with respect to FIG. 5, first and second gate nodes G1 and G2 have to be decoupled from the gate control signal at node 10. Therefore, in this situation at least switches $S_{1V}$ and $S_{2V}$ are opened. This is illustrated in FIG. 6D. Alternatively, in this situation, all four switches $S_{1V}$, SIR, $S_{1V}$, $S_{2R}$ are open, as shown in FIG. 6E.

Based on FIGS. 6B, 6C and 6D, if both the functionality for turn-off explained with respect to FIG. 2 as well as overvoltage protection are provided, first switch S1 needs to be implemented as a bidirectional switch, to be able to offer both the possibility of FIG. 6B and of 6D, whereas second switch S2 may be implemented as a unidirectional switch using only switch $S_{2V}$, to provide the functionality of FIG. 6C and of FIG. 6D. It should be noted that while in FIG. 6A to 6E bidirectional switches are implemented using two unidirectional switches, if a switch offers blocking of currents in both directions in other manners, this may also be used.

Figure 7:
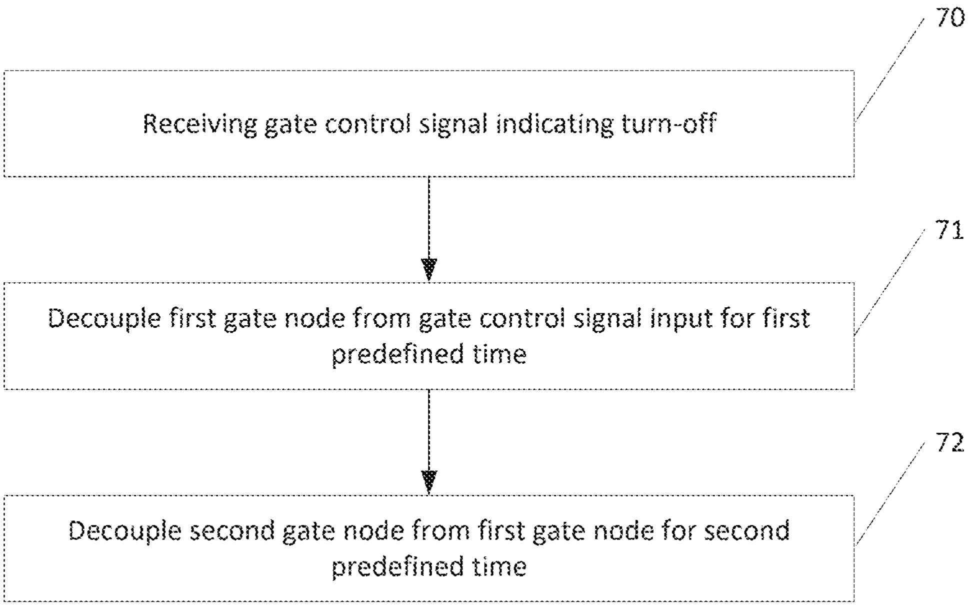
FIG. 7 is a flowchart illustrating a method according to an embodiment.

FIG. 7 illustrates a method for controlling a dual gate transistor arrangement according to an embodiment. The method of FIG. 7 illustrates the functionality explained referring to FIGS. 1, 2 and 4, and will be described with respect to these figures to avoid repetition.

At 70, the method comprises receiving a gate control signal indicating a turn-off of a dual gate transistor arrangement like dual gate transistor arrangement 14, for example at input node 10. At 71, the method comprises decoupling a first gate node of the dual gate transistor arrangement from the gate control signal input for a first predefined time, for example by opening switch S1 as explained with respect to FIG. 1. After the first predetermined time, the first gate node is coupled to the gate control signal input again, i.e. the decoupling takes place only during the first predetermined time here. Optionally, after the gate control signal input is coupled to the first gate node again, at 72 the method comprises decoupling the second gate node from the first gate node for a second predefined time, for example by opening second switch S2 as explained referring to FIG. 2.

Figure 8:
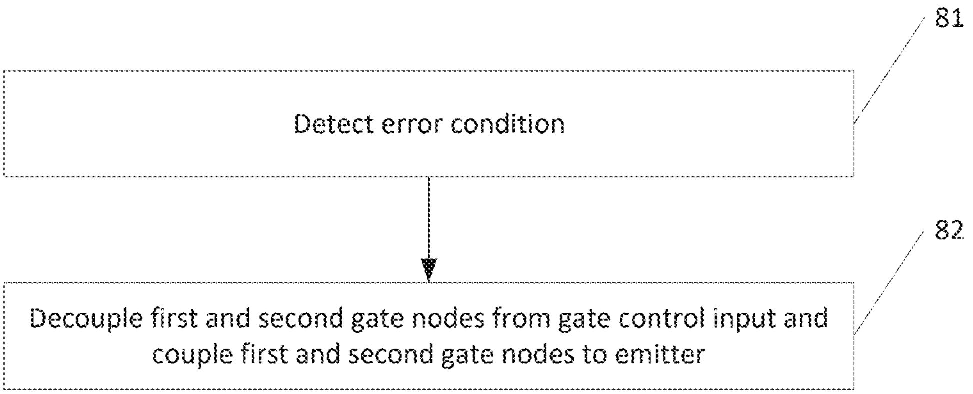
FIG. 8 is a flowchart illustrating a method according to a further embodiment.

In addition to the method of FIG. 7, error detection may be employed, as explained with respect to FIG. 5. A corresponding method is illustrated in FIG. 8.

At 81, the method comprises detecting an error condition, for example an overcurrent condition as explained referring to FIG. 5. At 82, in response to the overcurrent condition, the method comprises decoupling the first and second gate nodes from the gate control input and coupling the first and second gate node to an emitter of the dual gate transistor arrangement, for example by opening switches S1, S2 and closing switch S3 of FIG. 5.

Some embodiments are defined by the following examples:

Example 1. A circuit, comprising: an input node configured to receive a gate control signal for controlling a dual gate transistor arrangement, a first output node configured to be coupled to a first gate node of the dual gate transistor arrangement, a first switch coupled between the input node and the first output node, a second output node configured to be coupled to a second gate node of the dual gate transistor arrangement, and coupled to the input node, a control circuit configured to: upon detecting that the gate control signal indicates a turn-off of the transistor arrangement, open the first switch for a first predefined time period, and close the first switch after the first predefined time period.

Example 2. The circuit of example 1, wherein the first switch is a normally-on switch.

Example 3. The circuit of example 1, wherein the first switch when open at least blocks current from the first output node to the input node.

Example 4. The circuit of example 3, wherein the first switch is a bidirectional switch.

Example 5. The circuit of any one of examples 1 to 4, further comprising a second switch coupled between the input node and the second output node.

Example 6. The circuit of example 5, wherein the control circuit is configured to, when closing the first switch after opening the first switch upon detecting that the gate control signal indicates a turn-off of the transistor arrangement, open the second switch for a second predefined time period and close the second switch after the second predefined time period.

Example 7. The circuit of example 5 or 6, wherein the second switch is a normally on switch.

Example 8. The circuit of any one of examples 5 to 7, wherein the second switch when open at least blocks current from the input node to the second output node.

Example 9. The circuit of example 8, wherein the second switch is a bidirectional switch.

Example 10. The circuit of any one of examples 1 to 9, further comprising a further node configured to be connected to an emitter node of the transistor arrangement, at least one third switch coupling the first output node and second output node to the further node, wherein the control circuit is configured to close the at least one third switch in response to detecting an error event.

Example 11. The circuit of example 10, further comprising a first diode coupled between the first output node and the at least one third switch and a second diode coupled between the second output node and the at least one third switch.

Example 12. The circuit of example 10 or 11 and of any one of examples 5 to 9, wherein the control circuit is further configured to open the first switch and the second switch in response to detecting the error condition.

Example 13. A device, comprising: the circuit of any one of examples 1 to 12, and the transistor arrangement comprising the first gate node and the second gate node, wherein the first gate node is coupled to the first output node of the circuit and the second gate node is coupled to the second output node of the circuit.

Example 14. The device of example 13, wherein the device comprises a gate terminal coupled to the input node of the circuit, a collector terminal and an emitter terminal, wherein the transistor arrangement comprises a collector node coupled to the collector terminal of the device and an emitter node coupled to the emitter terminal of the device.

Example 15. The device of example 13 or 14, wherein the transistor arrangement comprises a monolithic dual gate insulated gate bipolar transistor having the first gate node and the first gate node.

Example 16. The device of example 13 or 14, wherein the transistor arrangement comprises a first insulated gate bipolar transistor having the first gate node and a second insulated gate bipolar transistor having the first gate node.

Example 17. The device of example 16, wherein an emitter of the first insulated gate bipolar transistor is coupled to an emitter of the second insulated gate bipolar transistor, and wherein a collector of the first insulated gate bipolar transistor is coupled to a collector of the second insulated gate bipolar transistor.

Example 18. The device of example 16 or 17, wherein the first insulated gate bipolar transistor is designed equal to the second insulated gate bipolar transistor.

Example 19. The device of example 16 or 17, wherein the first insulated gate bipolar transistor has a lower saturation voltage than the second insulated gate bipolar transistor.

Example 20. A method, comprising: receiving a gate control signal indicating a turn-off of a dual gate transistor, and decoupling a first gate node of the dual gate transistor arrangement from the gate control signal input for a first predefined time period, and coupling the first gate node to the gate control signal input after the first predefined time period elapsed.

Example 21. The method of example 20, further comprising: after the first predefined time period has elapsed, decoupling a second gate node of the dual gate transistor arrangement from the gate control signal input for a second predetermined time period.

Example 22. The method of example 20 or 21, further comprising: coupling both the first gate node and the second gate node to the gate control signal input at times other than during turning off the dual gate transistor arrangement.

Example 23. The method of any one of examples 20 to 22, further comprising: detecting an error condition, and decoupling both the first gate node and the second gate node from the gate control signal input and coupling both the first gate node and the second gate node to an emitter node of the dual gate transistor arrangement in response to detecting the error condition.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit, comprising:

an input node configured to receive a gate control signal for controlling a dual gate transistor arrangement;

a first output node configured to be coupled to a first gate node of the dual gate transistor arrangement;

a first switch coupled between the input node and the first output node;

a second output node configured to be coupled to a second gate node of the dual gate transistor arrangement, and coupled to the input node;

a control circuit configured to:

upon detecting that the gate control signal indicates a turn-off of the dual gate transistor arrangement, open the first switch for a first predefined time period; and close the first switch after the first predefined time period.

2. The circuit of claim 1, wherein the first switch is a normally-on switch.

3. The circuit of claim 1, wherein the first switch, when open, blocks current from the first output node to the input node.

4. The circuit of claim 3, wherein the first switch is a bidirectional switch.

5. The circuit of claim 1, further comprising:

a second switch coupled between the input node and the second output node.

6. The circuit of claim 5, wherein the control circuit is configured to:

when closing the first switch after opening the first switch upon detecting that the gate control signal indicates a turn-off of the transistor arrangement, open the second switch for a second predefined time period; and close the second switch after the second predefined time period.

7. The circuit of claim 5, wherein the second switch is a normally on switch.

8. The circuit of claim 5, wherein the second switch, when open, blocks current from the input node to the second output node.

9. The circuit of claim 8, wherein the second switch is a bidirectional switch.

10. The circuit of claim 1, further comprising:

a further node configured to be connected to an emitter node of the dual gate transistor arrangement;

at least one third switch coupling the first output node and second output node to the further node, wherein the control circuit is configured to close the at least one third switch in response to detecting an error event.

11. The circuit of claim 10, further comprising:

a first diode coupled between the first output node and the at least one third switch; and a second diode coupled between the second output node and the at least one third switch.

12. The circuit of claim 10, further comprising:

a second switch coupled between the input node and the second output node, wherein the control circuit is configured to open the first switch and the second switch in response to detecting the error event.

13. A device, comprising:

the circuit of claim 1; and the dual gate transistor arrangement comprising the first gate node and the second gate node, wherein the first gate node is coupled to the first output node of the circuit and the second gate node is coupled to the second output node of the circuit.

14. The device of claim 13, further comprising:

a gate terminal coupled to the input node of the circuit;

a collector terminal; and an emitter terminal, wherein the dual gate transistor arrangement comprises a collector node coupled to the collector terminal and an emitter node coupled to the emitter terminal.

15. The device of claim 13, wherein the dual gate transistor arrangement comprises a monolithic dual gate insulated gate bipolar transistor having the first gate node and the second gate node.

16. The device of claim 13, wherein the dual gate transistor arrangement comprises a first insulated gate bipolar transistor having the first gate node and a second insulated gate bipolar transistor having the second gate node.

17. The device of claim 16, wherein an emitter of the first insulated gate bipolar transistor is coupled to an emitter of the second insulated gate bipolar transistor, and wherein a collector of the first insulated gate bipolar transistor is coupled to a collector of the second insulated gate bipolar transistor.

18. A method, comprising:

receiving a gate control signal indicating a turn-off of a dual gate transistor arrangement;

decoupling a first gate node of the dual gate transistor arrangement from the gate control signal for a first predefined time period; and coupling the first gate node to the gate control signal after the first predefined time period has elapsed.

19. The method of claim 18, further comprising:

after the first predefined time period has elapsed, decoupling a second gate node of the dual gate transistor arrangement from the gate control signal for a second predetermined time period.

20. The method of claim 19, further comprising:

detecting an error condition; and in response to detecting the error condition, decoupling both the first gate node and the second gate node from the gate control signal and coupling both the first gate node and the second gate node to an emitter node of the dual gate transistor arrangement.

* * * * *